(12) United States Patent
Goto et al.

(10) Patent No.: US 8,106,305 B2
(45) Date of Patent: Jan. 31, 2012

(54) PRINT CIRCUIT BOARD WITH HIGH INSULATED REGION, METHOD OF MANUFACTURING THEREOF, AND PRINT CIRCUIT BOARD ASSEMBLY THEREOF

(75) Inventors: Masaharu Goto, Saitama Pref (JP); Minoru Uchida, Saitama Pref (JP); Koji Tokuno, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 365 days.

(21) Appl. No.: 12/512,029

(22) Filed: Jul. 30, 2009

(65) Prior Publication Data

US 2011/0024163 A1 Feb. 3, 2011

(51) Int. Cl.
*H05K 1/03* (2006.01)
*H05K 7/00* (2006.01)

(52) U.S. Cl. ............ 174/255; 174/260; 361/760
(58) Field of Classification Search .......... None
See application file for complete search history.

(56) References Cited

U.S. PATENT DOCUMENTS

| | | | |
|---|---|---|---|
| 5,490,325 A | | 2/1996 | Niemann et al. |
| 6,515,222 B2 * | | 2/2003 | Underwood et al. ......... 174/394 |
| 6,558,168 B2 | | 5/2003 | Iwasaki |
| 6,854,980 B2 | | 2/2005 | Iwasaki |
| 7,535,741 B2 * | | 5/2009 | Shiraishi et al. ............. 363/144 |
| 7,701,051 B2 * | | 4/2010 | Bayerer et al. ............... 257/700 |
| 7,999,358 B2 * | | 8/2011 | Bakalski et al. ............. 257/659 |

FOREIGN PATENT DOCUMENTS

JP 57-141995 A1 9/1982

OTHER PUBLICATIONS

IPC, Surface Mount Design and Land Pattern Standard, IPC-SM-782A Includes: Amendment 1 and 2, Apr. 1999, pp. 127, IPC, Illinois U.S.A.

* cited by examiner

*Primary Examiner* — Boris Chervinsky

(57) ABSTRACT

A print circuit board includes: a first surface; a guard plane disposed on an inner layer; a high insulated region formed on the first surface of the board so as to be opposed to the guard plane, the high insulated region being substantially surrounded by one or more first guard patterns; and a quasi-high insulated region formed on the first surface of the board so as to be disposed adjacent to the high insulated region. The quasi-high insulated region is substantially surrounded by at least a part of the one or more first guard patterns and by one or more second guard patterns, in which the one or more first guard patterns and the one or more second guard patterns are each formed by forming one or more trenches in the first surface of the board so as to expose the guard plane on a bottom surface of the trenches.

19 Claims, 3 Drawing Sheets

PRINT CIRCUIT BOARD WITH HIGH INSULATED REGION, METHOD OF MANUFACTURING THEREOF, AND PRINT CIRCUIT BOARD ASSEMBLY THEREOF

BACKGROUND OF THE INVENTION

Conventionally, various methods have been developed for forming a high insulated region on a print circuit board.

One of the conventional technologies for a print circuit board with a high insulated region is disclosed in Japanese Patent Application Laid-open No. Sho 57-141995 (hereinafter referred to as Nakajima Document), in which a periphery of the high insulated region is completely surrounded by a slit that passes through the circuit board from an upper side to a lower side thereof, and the high insulated region is supported by terminals of an electronic component to be connected. Another conventional technology is disclosed in U.S. Pat. No. 5,490,325 (hereinafter referred to as Niemann Document), in which the periphery of the high insulated region is surrounded by a slit that passes through the circuit board from the upper side to the lower side thereof except for stem portions for supporting the region, and through holes are provided to the stem portions.

Further, another conventional technology for the print circuit board with a high insulated region is disclosed in U.S. Pat. No. 6,854,980 (hereinafter referred to as Iwasaki '980 Document) that is assigned to the applicant of the present application, in which a bottom surface and all side surfaces of the high insulated region are surrounded by a guard conductor. Still another conventional technology is disclosed in U.S. Pat. No. 6,558,168 (hereinafter referred to as Iwasaki '168 Document) that is assigned to the applicant of the present application, in which the bottom surface and all the side surfaces of the high insulated region are surrounded by a guard conductor, and a gap or a trench is provided between the side surface and the high insulated region.

However, according to the conventional technologies, it is difficult to provide a print circuit board with a high insulated region on which surface mount devices (SMDs) are mounted at low cost and high density. The reason thereof is described later in detail, but shortly the reason is as follows. If the slit is used, restrictions on high density mounting will occur for securing strength of the circuit board and from a viewpoint of arrangement of components and wires. In addition, it is not appropriate for cost and size to provide to the circuit board the side surface of the guard conductor as described in Iwasaki '980 and '168 Documents that can be used for insulating between adjacent terminals of the SMD.

Therefore, it is required to provide a print circuit board with a high insulated region at low cost and high density that can be used for preventing leakage between adjacent terminals of the SMD, and a method of manufacturing the same.

SUMMARY

A print circuit board according to the present invention includes: a first surface; a guard plane disposed on an inner layer of the print circuit board; a high insulated region formed on the first surface of the print circuit board so as to be opposed to the guard plane, the high insulated region being substantially surrounded by one or more first guard patterns; and a quasi-high insulated region formed on the first surface of the print circuit board so as to be disposed adjacent to the high insulated region, the quasi-high insulated region being substantially surrounded by at least a part of the one or more first guard patterns and by one or more second guard patterns, in which the one or more first guard patterns and the one or more second guard patterns are each formed by forming one or more trenches in the first surface of the print circuit board so as to expose the guard plane on a bottom surface of the one or more trenches.

With this structure, leak current that flows into the high insulated region is shielded by the guard plane from a bottom surface thereof and is interrupted by a space or a gap due to the one or more trenches formed on the first guard patterns that substantially surrounds a periphery of the high insulated region and by one or more conductors of the bottom surface of the one or more trenches having a guard potential (i.e., the guard pattern) from side surfaces of the circuit board and upper surfaces of the circuit board (i.e., from the first surface). Moreover, if flowing-in of non-negligible leak current is still considerable even after the leak current is reduced by the first guard patterns and the one or more trenches formed thereon, the quasi-high insulated region having a similar structure is provided so as to be adjacent to the high insulated region, to thereby reduce the leak current by two stages. Accordingly, sufficient effect can be obtained for reducing the leak current. Note that the quasi-high insulated region is formed on the same guard plane as the guard plane that is used for shielding the bottom surface of the high insulated region. In addition, a periphery of the quasi-high insulated region is surrounded by a part or the whole of the above-mentioned first guard patterns and the one or more trenches formed thereon, and the second guard patterns and the one or more trenches formed thereon.

Note that the quasi-high insulated region may be disposed so as to surround the high insulated region or may be disposed to the side closer to a leak source or a noise source on the circuit board with respect to the high insulated region.

BRIEF DESCRIPTION OF THE DRAWINGS

Further preferred features of the invention will now be described for the sake of example only with reference to the following figures, in which.

DETAILED DESCRIPTION

Figure 1:
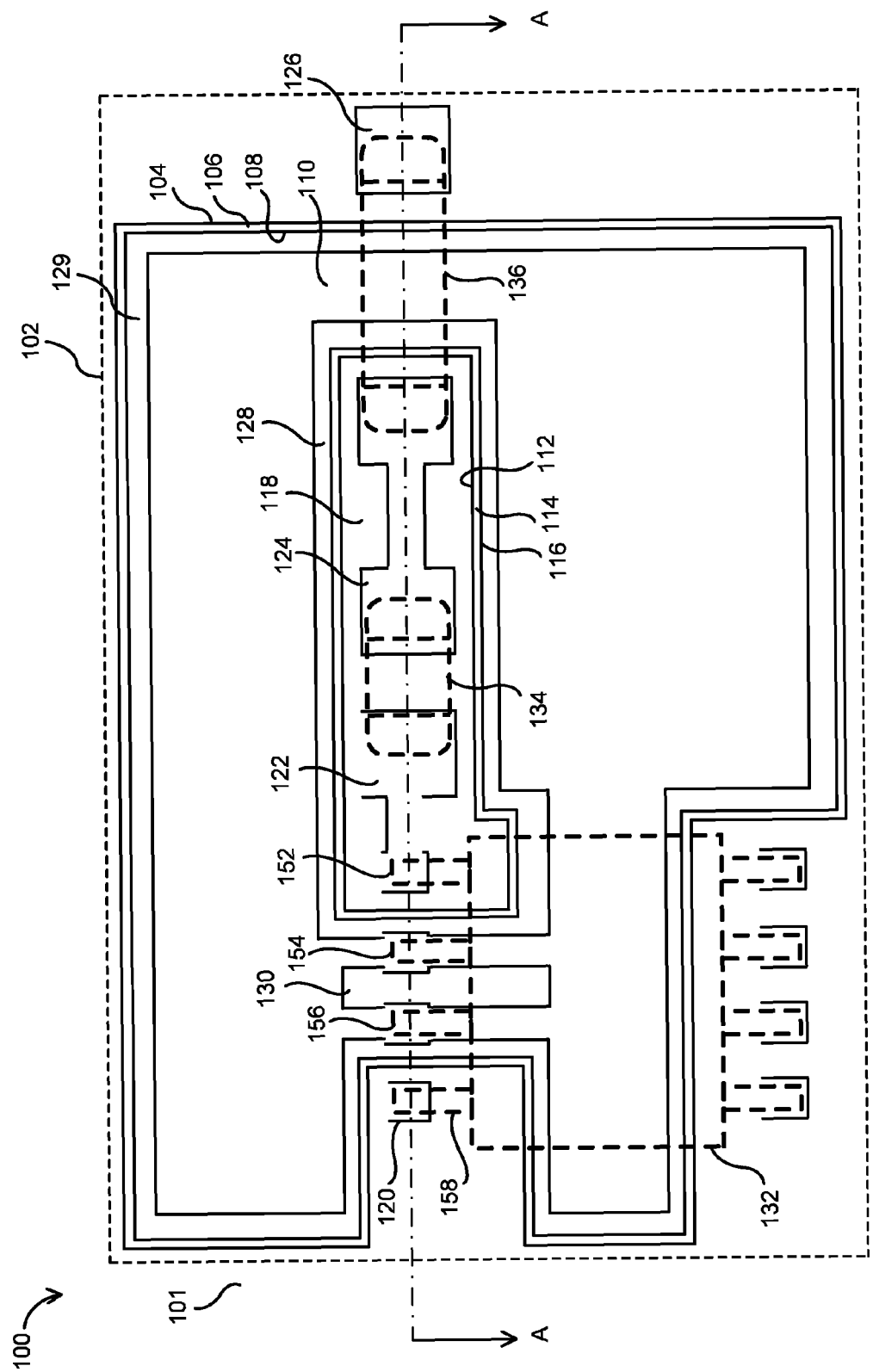
FIG. 1 is a top view illustrating a print circuit board with a high insulated region according to an embodiment of the present invention.

If the conventional technologies described above are used for manufacturing a print circuit board with a high insulated region on which surface mount devices (SMDs) are mounted at low cost and high density, the following problems may occur.

If the technology described in Nakajima Document is applied to an SMD circuit board, it is necessary first to adjust positions of terminals of the surface mount device very accurately between the circuit board of the high insulated region and the circuit board of a low insulated region around the high insulated region so as to solder the terminals. Therefore, low cost manufacturing cannot be realized. In addition, the circuit boards may have weak strength, which causes a reliability problem. Particularly, in these years, RoHS compliant solder is apt to be rigid, and accordingly reliability of the soldered portions may be affected by the rigidness when the circuit board is vibrated. In addition, because the circuit boards are separated from each other by the slit, there some restrictions on an arrangement of components and wires required for supplying control signals to the high insulated region or to peripheral circuits, for allowing other signals to pass through, and for mounting components on a back side of the circuit board. Thus, it is difficult to realize high density mounting.

If the technology described in Niemann Document is applied to the SMD circuit board, the circuit board has weak strength so that a reliability problem may occur because the circuit board has the slit that passes through the circuit board from the upper side to the lower side thereof as described above. Moreover, because there are restrictions on an arrangement of components and wires on the back side of the circuit board, it is difficult to manufacture the SMD circuit board on which components are mounted at low cost and high density.

In general, a distance between adjacent terminals of a current typical SMD is 1.27 mm of SOIC-8 standard, and a distance between pads for adjacent terminals is usually 0.67 mm. On the other hand, a router cutting method is usually used for forming the slit in the circuit board, and the minimum slit width by low-cost router cutting is 1 mm. Therefore, it is not impossible but is relatively expensive to form the slit by the router cutting method between pads for adjacent terminals of the SMD. In contrast, if a laser beam machining method is used, it is possible to cut by a slit width smaller than 0.67 mm at low cost. However, a thickness that can be cut is substantially the same as the slit width. Therefore, the laser beam machining method cannot be used for forming the slit that passes through the circuit board from the upper side to the lower side thereof because an ordinary print circuit board thickness is at least 1.6 mm.

Next, if the technology described in Iwasaki '980 Document is applied to the SMD circuit board, there arises a problem of a method involving forming the guard conductor on the side surfaces of the high insulated region. The guard conductor on the side surfaces is typically formed by further machining the multilayered circuit board with the inner layer that is the guard conductor of the bottom surface, forming the trench from the surface to the guard conductor of the inner layer, and performing a copper plating process on the trench. However, the copper plating process of the trench takes high cost. In addition, it is necessary to use the router cutting method with a narrow slit width at high cost as described above in order to form the trench passing through between pads for adjacent terminals of the SMD. Further, with the current plating technology, it is difficult to form a uniform plated layer on a region having a width smaller than 1 mm (that is a distance between adjacent terminals of a typical SMD) at a standard cost because flowability of plating liquid is deteriorated.

Finally, if the technology described in Iwasaki '168 Document is applied to the SMD circuit board, it is necessary first to form the trench having a width of 0.67 mm or smaller and to perform the copper plating process only on one side thereof. It is apparent from the above discussion that the low-cost manufacturing is difficult.

Therefore, it is difficult to manufacture a print circuit board with a high insulated region on which SMDs are mounted at low cost and high density by the conventional technologies.

As described above, the distance between adjacent terminals of the SMD is different depending on a standard, but the distance is usually 1.27 mm according to SOIC-8 standard that is a current typical standard for EIAJ or JEDEC small-outline integrated circuit (SOIC) components, and a distance between pads for adjacent terminals is 0.67 mm. Therefore, from the above consideration, the inventors of the present invention arrived at the idea that as for the print circuit board on which SMDs are mounted in accordance with the current SOIC-8 or equivalent standard for example, it is necessary to provide a structure having a width of approximately 0.2 mm between adjacent terminals, which not only can reduce leak current but also enables high-density component mount, taking a production error of the pad for connecting the terminal into account.

Figure 2:
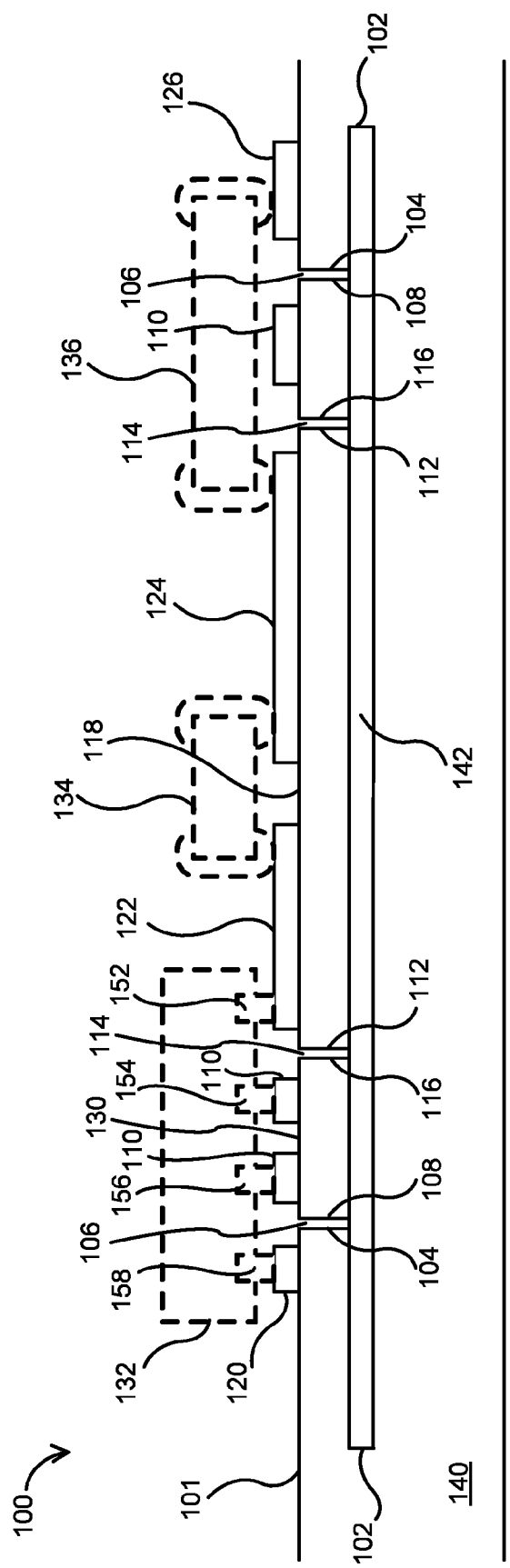
FIG. 2 is a cross sectional view of the print circuit board illustrated in FIG. 1 cut along the line A-A.

A print circuit board 100 with a high insulated region that is one of embodiments according to the present invention is described with reference to FIGS. 1 and 2. FIG. 1 illustrates a top view of the print circuit board 100, and FIG. 2 illustrates a cross sectional view cut along the line A-A of FIG. 1.

For a simple description, SMDs to be mounted are illustrated by thick broken lines that are denoted by 132, 134 and 136 in FIG. 1. In FIG. 1, a region surrounded by a broken line 102 is a guard plane (i.e., guard conductor plate) formed on an inner layer of the circuit board 100. A region inside a solid line 112 is the high insulated region. Note that the guard plane in this specification is preferably connected to a guard signal according to an active guard method. Conductor patterns 122 and 124 are disposed in the high insulated region surrounded by the solid line 112. The conductor pattern 122 is connected to a terminal 152 of the SMD 132 and one of terminals of the SMD 134. The conductor pattern 124 is connected to the other terminal of the SMD 134 and one of terminals of the SMD 136. Other region 118 of a surface of the high insulated region surrounded by the solid line 112 is a non-conductive region in which no conductor pattern is formed.

The high insulated region surrounded by the solid line 112 is surrounded by a trench 114, and a guard pattern is provided to the bottom of the trench 114. Numeral 114 of FIG. 1 also denotes the guard pattern on the bottom of the trench. The solid lines 112 and 116 indicate side surfaces or side walls on both sides of the trench denoted by numeral 114, and those side surfaces are made of a material of the circuit board.

Next, a region surrounded by the solid line 116 and a solid line 108 is a quasi-high insulated region. On this quasi-high insulated region, there are formed a conductor pattern 110 and non-conductive regions 128, 129 and 130 in which no conductor pattern is formed. The conductor pattern 110 in the quasi-high insulated region is connected to terminals 154 and 156 of the SMD 132. The outside of the quasi-high insulated region is surrounded by a trench 106, and a guard pattern is provided to the bottom of the trench. Numeral 106 of FIG. 1 also denotes the guard pattern on the bottom of the trench. Solid lines 104 and 108 indicate side surfaces or side walls on both sides of the trench denoted by numeral 106, and those side surfaces are made of a material of the circuit board.

Conductor patterns 120 and 126 are disposed on a low insulated region 101 outside the quasi-high insulated region. The conductor patterns 120 and 126 are disposed above the guard plane of the inner layer here. The conductor pattern 120 is connected to the terminal 158 of the SMD 132, and the conductor pattern 126 is connected to the other terminal of the SMD 136. In this way, the guard plane of the inner layer can be disposed to extend to a region below a part of the low insulated region 101 in accordance with a degree of required countermeasures against noise.

Note that the trench 114 surrounding the outside of the high insulated region is disposed to pass through between the adjacent terminals 152 and 154 of the SMD 132 in the above description. In addition, note that the trench 106 surrounding the outside of the quasi-high insulated region is also disposed to pass through between the adjacent terminals 156 and 158 of the SMD 132.

Next, with reference to FIG. 2 illustrating the cross section cut along the line A-A of FIG. 1, a structure of the print circuit board 100 with a high insulated region according to the present invention is described. A guard plane 142 is formed inside the circuit board 140, and an end portion of the guard plane 142 corresponds to the broken line 102 of FIG. 1.

The trench 114 disposed between the terminals 152 and 154 of the SMD 132 of FIG. 2 is dug down from the surface of the circuit board to the depth until the inner guard plane 142 is exposed. As a result, the side surface 112 is formed to surround the high insulated region, and the side surface 116 is formed on the side of the quasi-high insulated region. The same structure is true for the cross section of the trench 114 close to the conductor pattern 124 of the SMD 136.

With the structure described above, in the high insulated region in which the conductor patterns 122 and 124 are formed on the surface of the circuit board, leakage from the bottom in the circuit board is shielded by the guard plane 142. Leakage from the adjacent region (here, the quasi-high insulated region in which the conductor pattern 110 is formed on the surface of the circuit board) via the inside of the circuit board is shielded by a gap or an air gap of the trench 114. Moreover, leakage along the bottom surface of the trench 114 is shielded by the guard plane 142 existing as the guard conductor on the bottom surface. Thus, leakage from the periphery can be reduced so that the high insulated region can be formed.

In addition, the side surface of the trench 114 is made of the circuit board and can be formed by a simple process of only digging the trench in the circuit board so that low cost can be realized. The trench 114 can be formed by using the laser beam machining method at low cost. Alternatively, the trench 114 can be formed by the router cutting method or other various machining method as long as the method can expose a part of the guard plane of the inner layer. If the SMD of the SOIC-8 standard is mounted, it is preferable that the width of the trench should be 0.2 mm considering a distance between terminals and a margin of the pad for terminal. In addition, the depth of the trench to the guard plane 142 is, for example, 0.2 to 0.4 mm if the laser beam machining method is used. Note that, however, the present invention does not limit the width or the depth of the trench. Considering evolution of the SMD standard to be more refined in the future, it is preferable that the width of the trench formed by the laser beam machining method or the router cutting method that is useful for the present invention should be within a range from 0.05 to 1.27 mm (i.e., the pad is trimmed if the maximum width is adopted, and the trench can be formed to have the width up to almost the same value as the distance between terminals of the SOIC-8 standard). In addition, according to similar consideration, it is preferable that the distance between pads for the trench to pass through should be within a range from 0.05 to 0.67 mm.

In the same manner, as to the trench surrounding the quasi-high insulated region, the inside of the quasi-high insulated region is surrounded by the above-mentioned trench 114 surrounding the high insulated region, and further the outside of the quasi-high insulated region is surrounded by the trench 106. The trench 106 is formed similarly to the trench 114 by digging down the circuit board from the surface thereof until the inner guard plane 142 is exposed. As a result, the side surface 108 surrounds the quasi-high insulated region, and another side surface 104 opposed to the side surface 108 surrounds the side of the low insulated region.

With the structure described above, in the quasi-high insulated region in which the conductor pattern 110 is formed on the surface of the circuit board, leakage from the bottom in the circuit board is shielded by the guard plane 142. In addition, leakage from the adjacent region (here, the low insulated region in which the conductor patterns 120 and 126 are disposed on the surface of the circuit board) via the inside of the circuit board is shielded by a gap or an air gap of the trench 106. Moreover, leakage along the bottom surface of the trench 106 is shielded by the guard plane 142 existing as the guard conductor on the bottom surface. Thus, leakage from the periphery can be reduced so that the quasi-high insulated region can be formed. As a result, leakage to the high insulated region can be reduced more.

Here, as an example of the circuit including the high insulated region, the quasi-high insulated region, and the low insulated region as illustrated in FIGS. 1 and 2, it is supposed that the SMD 132 is a low input current operational amplifier device having two circuits, the terminal 152 disposed in the high insulated region is a non-inverting input terminal, the terminal 154 disposed in the quasi-high insulated region is an inverting input terminal, the terminal 156 disposed in the same quasi-high insulated region is an output terminal, and the terminal 158 disposed in the low insulated region is a positive voltage power source input terminal. When the circuit is connected as illustrated in FIG. 1, the guard signal having the same potential as a high insulation signal applied to the conductor pattern 122 is generated and output from the output terminal 156. The positive voltage power source input terminal 158 has a potential difference with the conductor pattern 122 and is close to the conductor pattern 122, and hence the positive voltage power source input terminal 158 can be a source of leak current to the conductor pattern 122 in the high insulated region. However, disposing therebetween the trench 106 and the guard pattern on the bottom of the trench 106, the quasi-high insulated region, as well as the trench 114 and the guard pattern on the bottom of the trench 114, influence of the leak current can be shielded effectively.

Figure 3:
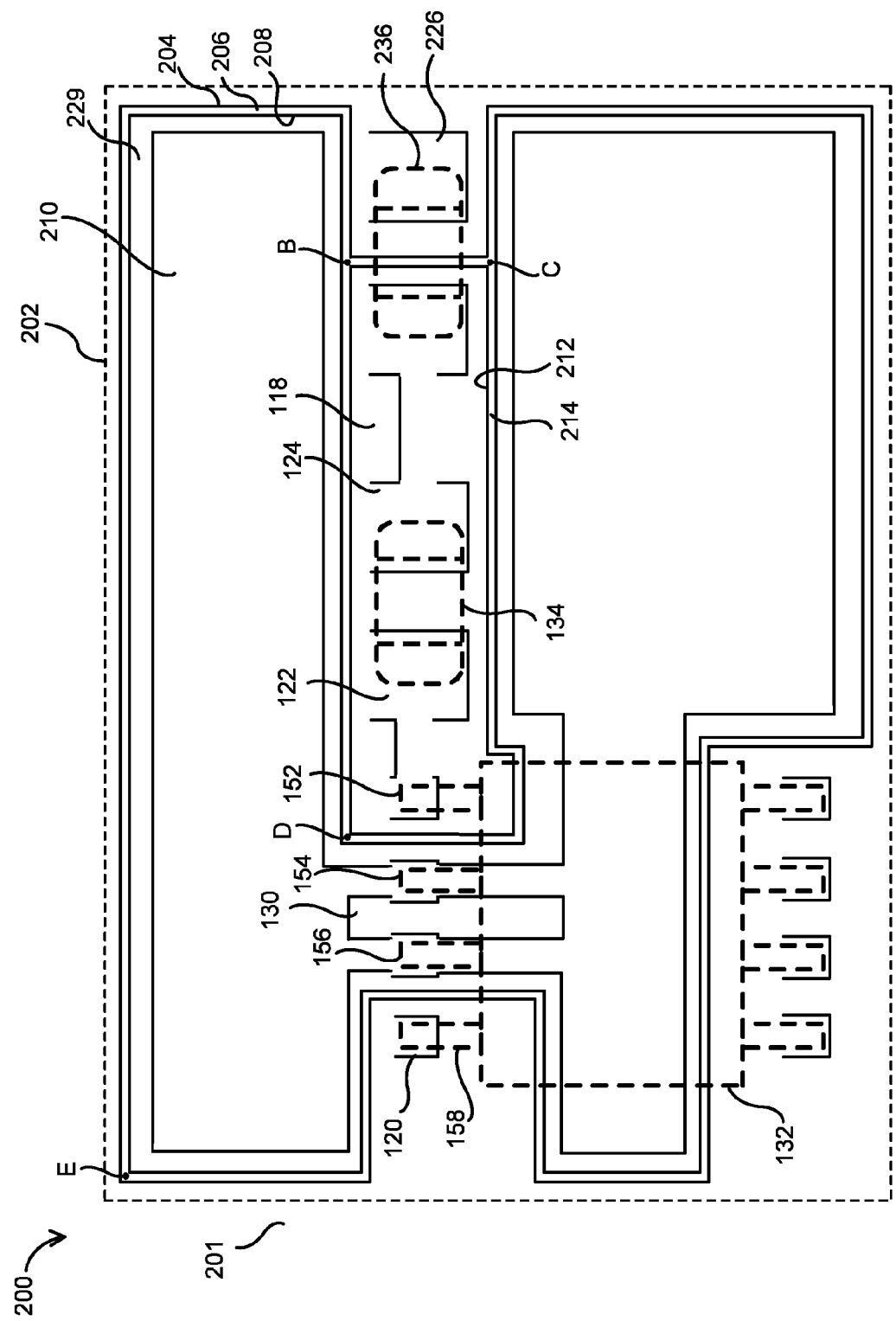
FIG. 3 is a top view illustrating a print circuit board with a high insulated region according to another embodiment of the present invention.

Next, a print circuit board 200 with a high insulated region that is another embodiment of the present invention is described with reference to FIG. 3. Note that, in FIG. 3, the same structural element as in FIG. 1 is denoted by the same reference numeral. In FIG. 3, a region surrounded by a broken line 202 is a guard plane (i.e., guard conductor plate) formed on an inner layer of the circuit board 200. In FIG. 3, the high insulated region is surrounded by a solid line 212 while the quasi-high insulated region is surrounded by a solid line 208. Here, note that the quasi-high insulated region is adjacent to the high insulated region but does not completely surround the high insulated region unlike in FIG. 1. In other words, if the leakage from a periphery of a conductive pad 226 that is connected to one of the terminals of an SMD 236 and is disposed in a low insulated region 201 is estimated to be not so large, it is not necessary to dispose the quasi-high insulated region here and this arrangement can be adopted. Note that numeral 210 denotes a conductor pattern formed in the quasi-high insulated region illustrated in FIG. 3, and numeral 229 denotes a non-conductive region on the quasi-high insulated region in which no conductor pattern is formed.

In this case, the high insulated region is formed by a trench 214 indicated as a closed section B-C-D-B and the side surface 212 thereof. On the bottom surface of the trench 214, there is the guard pattern having the exposed guard plane similarly to the circuit board 100 illustrated in FIG. 1. The quasi-high insulated region is surrounded by a section B-D-C of the trench 214 and a section B-E-C of a trench 206, and is surrounded by the side surface 208. The side surface 204 forms the side surface outside a closed section B-E-C-B by the trenches 214 and 206, and contributes to formation of a gap for preventing the leakage from the low insulated region. Note that the machining method for forming the trenches 214 and 206 is the same as the embodiment illustrated in FIG. 1.

Here, as an example of the circuit including the high insulated region, the quasi-high insulated region, and the low insulated region as illustrated in FIG. 3, it is supposed that the SMD 132 is a low input current operational amplifier device having two circuits, the terminal 152 disposed in the high insulated region is a non-inverting input terminal, the terminal 154 disposed in the quasi-high insulated region is the non-inverting input terminal, the terminal 156 disposed in the same quasi-high insulated region is an output terminal, and the terminal 158 disposed in the low insulated region is a positive voltage power source input terminal as illustrated in FIG. 1. Similarly to the above discussion, between the low insulated region 201 and the high insulated region surrounded by the solid line 212, there are disposed the trench 206 and the guard pattern on the bottom of the trench 206, the quasi-high insulated region surrounded by the solid line 208, and the trench 214 and the guard pattern on the bottom of the trench 214, thereby effectively shielding influence of the leak current from the terminal 158 to the high insulated region. In addition, if the leak current from the conductive pad 226 to the high insulated region is estimated to be not so large in accordance with characteristics of the signal flowing through the conductive pad 226, it is possible to adopt a structure without the quasi-high insulated region therebetween.

With the structure described above, the quasi-high insulated region is disposed effectively in the vicinity of the high insulated region in accordance with intensity of the leak source or the noise source. As a result, the print circuit board 200 with a high insulated region can be constituted at low cost.

Thus, the embodiments of the present invention are described above, but the embodiments can be modified and changed variously based on the concept of the present invention. For instance, the trench surrounding the high insulated region or the quasi-high insulated region is a continuous trench without interruption in the above description, but it is possible to constitute using a plurality trenches that are separated from each other to a degree of not causing a problem in the insulation performance.

In addition, the guard plane 142 of the inner layer can be disposed in a form corresponding to anti-leak performance or anti-noise performance that is required to each of the high insulated region, the quasi-high insulated region, and the low insulated region. In other words, as to the high insulated region, it is preferable to dispose the guard plane so as to cover the lower part of the entire high insulated region for preventing leakage from the lower part in the circuit board. On the other hand, it is possible to adopt a structure in which the part of the guard plane disposed under the quasi-high insulated region does not cover, instead of covering the lower part of the entire quasi-high insulated region, a part of the quasi-high insulated region, i.e., has a hole in part of the guard plane, in accordance with leakage or sensitivity to noise in the circuit disposed on the quasi-high insulated region. Moreover, it is also possible to adopt a structure in which the part of the guard plane disposed under the low insulated region covers only the part under a critical part of the circuit disposed on the low insulated region, in which the leakage or the noise can affect critically to the high insulated region or the quasi-high insulated region, as illustrated in FIGS. 1 and 3. Alternatively, it is possible that there is a hole in part of the guard plane under a part of the circuit, or the guard plane may cover the lower part of the entire low insulated region.

Moreover, it is possible to dispose a pattern for supplying a power, a control signal or the like to a high insulated circuit or the peripheral circuit in the part under the guard plane 142 in the circuit board illustrated in FIG. 2 or to dispose a completely independent signal line to pass through the same part without deteriorating the insulation performance. Further, it is possible to mount the SMD also on the opposite side of the circuit board, so as to pursue higher density mounting and a lower cost.

The invention claimed is:

1. A print circuit board, comprising:
   a first surface;
   a guard plane disposed on an inner layer of the print circuit board;
   a high insulated region formed on the first surface of the print circuit board so as to be opposed to the guard plane, the high insulated region being substantially surrounded by one or more first guard patterns; and
   a quasi-high insulated region formed on the first surface of the print circuit board so as to be disposed adjacent to the high insulated region, the quasi-high insulated region being substantially surrounded by at least a part of the one or more first guard patterns and by one or more second guard patterns,
   wherein the one or more first guard patterns and the one or more second guard patterns are each formed by forming one or more trenches in the first surface of the print circuit board so as to expose the guard plane on a bottom surface of the one or more trenches.

2. A print circuit board according to claim 1, further comprising a low insulated region disposed adjacent to one of the quasi-high insulated region and the high insulated region.

3. A print circuit board according to claim 2, wherein the guard plane is disposed under an entire of the high insulated region, a part of the quasi-high insulated region, and a part of the low insulated region.

4. A print circuit board according to claim 2, wherein the guard plane is disposed under an entire of the high insulated region, an entire of the quasi-high insulated region, and a part of the low insulated region.

5. A print circuit board according to claim 1, wherein the quasi-high insulated region surrounds the high insulated region.

6. A print circuit board according to claim 1, further comprising:
   a first pad for connecting a first terminal of a surface mount device in the high insulated region; and
   a second pad for connecting a second terminal of the surface mount device in the quasi-high insulated region, the second terminal being adjacent to the first terminal.

7. A print circuit board according to claim 6, wherein the first pad and the second pad are disposed corresponding to the first terminal and the second terminal that are disposed on a longitudinal side of the surface mount device.

8. A print circuit board according to claim 6, further comprising:
   a third pad for connecting a third terminal of the surface mount device in the quasi-high insulated region; and
   a fourth pad for connecting a fourth terminal of the surface mount device in the low insulated region, the fourth terminal being adjacent to the third terminal.

9. A print circuit board according to claim 1, wherein the trench comprises a side wall of the print circuit board.

10. A print circuit board according to claim 1, wherein the trench has a width within a range from 0.05 mm to 1.27 mm.

11. A print circuit board according to claim 6, wherein a distance between the first pad and the second pad is within a range from 0.05 mm to 0.67 mm.

12. A method of manufacturing the print circuit board of claim 1, the method comprising:

forming the one or more trenches so that the guard plane is exposed to the bottom surface of the one or more trenches; and machining the print circuit board with a laser beam in the forming the one or more trenches.

13. A print circuit board assembly, comprising:

a surface mount device comprising a first terminal and a second terminal that are adjacent to each other;

the print circuit board according to claim 1;

a first pad disposed in the high insulated region, the first pad being connected to the first terminal of the surface mount device; and a second pad disposed in the quasi-high insulated region, the second pad being connected to the second terminal of the surface mount device.

14. A print circuit board assembly according to claim 13, wherein:

the surface mount device further comprises a third terminal and a fourth terminal that are adjacent to each other;

the print circuit board comprises a low insulated region disposed adjacent to one of the quasi-high insulated region and the high insulated region;

the quasi-high insulated region comprises a third pad for connecting the third terminal of the surface mount device; and the low insulated region comprises a fourth pad for connecting the fourth terminal of the surface mount device.

15. A print circuit board assembly according to claim 13, wherein the quasi-high insulated region surrounds the high insulated region.

16. A print circuit board assembly according to claim 13, wherein the first terminal and the second terminal of the surface mount device are disposed on a longitudinal side of the surface mount device.

17. A print circuit board assembly according to claim 13, wherein the one or more trenches comprise a side wall of the print circuit board.

18. A print circuit board assembly according to claim 13, wherein the one or more trenches have a width within a range from 0.05 mm to 1.27 mm.

19. A print circuit board assembly according to claim 13, wherein a distance between the first pad and the second pad is within a range from 0.05 mm to 0.67 mm.

* * * * *